(12) United States Patent
Kuo

(10) Patent No.: US 9,159,857 B2
(45) Date of Patent: Oct. 13, 2015

(54) SOLAR APPARATUS AND MOUNTING SYSTEM THEREOF

(71) Applicant: AU Optronics Corporation, Hsin-Chu (TW)

(72) Inventor: Han-Ching Kuo, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 86 days.

(21) Appl. No.: 13/951,081

(22) Filed: Jul. 25, 2013

(65) Prior Publication Data

US 2014/0083504 A1    Mar. 27, 2014

(30) Foreign Application Priority Data

Sep. 26, 2012   (CN) .......................... 2012 1 0363943

(51) Int. Cl.
| | |
|---|---|
| F24J 2/52 | (2006.01) |
| H02S 20/24 | (2014.01) |
| H01L 31/042 | (2014.01) |
| F24J 2/46 | (2006.01) |

(52) U.S. Cl.
CPC ........... *H01L 31/0422* (2013.01); *F24J 2/4638* (2013.01); *F24J 2/526* (2013.01); *F24J 2/5211* (2013.01); *F24J 2/5233* (2013.01); *F24J 2/5239* (2013.01); *F24J 2/5258* (2013.01); *H02S 20/24* (2014.12); *F24J 2002/5292* (2013.01); *Y02E 10/47* (2013.01); *Y02E 10/50* (2013.01)

(58) Field of Classification Search
CPC ........ Y02E 10/47; Y02B 10/12; F24J 2/5211; F24J 2/5254; F24J 2/5239
USPC .................. 52/173.3; 136/251, 244; 257/433; 126/623
See application file for complete search history.

(56) References Cited

U.S. PATENT DOCUMENTS

| | | | | |
|---|---|---|---|---|
| 4,058,111 | A | * | 11/1977 | Wendel ......................... 126/570 |
| 5,797,573 | A | * | 8/1998 | Nasu ......................... 248/231.31 |
| 6,370,828 | B1 | * | 4/2002 | Genschorek .................... 52/200 |
| 7,435,897 | B2 | | 10/2008 | Russell |
| 8,256,169 | B2 | | 9/2012 | Cusson et al. |
| 8,387,319 | B1 | * | 3/2013 | Gilles-Gagnon et al. .... 52/173.3 |
| 8,464,496 | B2 | | 6/2013 | Cusson et al. |
| 8,733,027 | B1 | * | 5/2014 | Marston et al. .................... 52/24 |
| 2005/0115176 | A1 | * | 6/2005 | Russell ......................... 52/220.1 |
| 2006/0053706 | A1 | * | 3/2006 | Russell ......................... 52/173.3 |
| 2008/0087275 | A1 | * | 4/2008 | Sade et al. ..................... 126/623 |

(Continued)

FOREIGN PATENT DOCUMENTS

| | | |
|---|---|---|
| CN | 201252499 | 6/2009 |
| CN | 102245979 | 11/2011 |

(Continued)

*Primary Examiner* — Elizabeth A Plummer
*Assistant Examiner* — Kyle Walraed-Sullivan
(74) *Attorney, Agent, or Firm* — WPAT, PC; Justin King

(57) ABSTRACT

A solar apparatus includes a solar cell, a frame including a main body and a hollow rib, a pair of first support racks, and a pair of second support racks. The main body surrounds the edge of the solar cell. The hollow rib protrudes over the circumference of the main body. The first support racks are located on a first side of the frame, and each of the first support racks includes a first engaging clamp for coupling to the hollow rib of the frame. The second support racks are located on a second side of the frame facing away from the first side, and each of the second support racks includes a second engaging clamp for coupling to the hollow rib of the frame.

22 Claims, 21 Drawing Sheets

(56) References Cited

U.S. PATENT DOCUMENTS

| | | | |
|---|---|---|---|
| 2009/0320907 A1* | 12/2009 | Botkin et al. | 136/251 |
| 2010/0116324 A1* | 5/2010 | O'Brien et al. | 136/251 |
| 2010/0154784 A1* | 6/2010 | King et al. | 126/623 |
| 2011/0154750 A1* | 6/2011 | Welter et al. | 52/173.3 |
| 2011/0203637 A1 | 8/2011 | Patton et al. | |
| 2011/0239554 A1* | 10/2011 | Tsuzuki et al. | 52/173.3 |
| 2011/0240101 A1 | 10/2011 | Sagayama et al. | |
| 2011/0296773 A1* | 12/2011 | Kellerman | 52/173.3 |
| 2012/0048345 A1* | 3/2012 | Wood et al. | 136/251 |
| 2013/0327373 A1* | 12/2013 | Gentry et al. | 136/251 |
| 2013/0340811 A1* | 12/2013 | Danning et al. | 136/251 |
| 2014/0014166 A1* | 1/2014 | Endou | 136/251 |

FOREIGN PATENT DOCUMENTS

| | | |
|---|---|---|
| CN | 102362362 | 2/2012 |
| CN | 202307937 | 7/2012 |
| JP | 2010-261180 | 11/2010 |

\* cited by examiner

SOLAR APPARATUS AND MOUNTING SYSTEM THEREOF

RELATED APPLICATIONS

This application claims priority to China Application Serial Number 201210363943.1, filed Sep. 26, 2012, which is herein incorporated by reference.

BACKGROUND

1. Field of Invention

The present disclosure relates to a solar apparatus and a mounting system thereof.

2. Description of Related Art

A solar panel can transform optical energy into electrical energy, and the optical energy mainly comes from the sunlight. Since the solar panel does not cause greenhouse gases during the transformation process, an environment using green energy resources can be achieved. Recently, with the advance and development of the solar technology, the price of the solar panel has been reduced greatly, making the solar panel be more popular in the consumer market. For example, a solar module has been widely applied to the roof of a house and the external wall of a building, and various electronics.

Typically, a solar module disposed on the roof of a building includes a solar cell and a foot. The foot is fixed on the surface of the roof, and the solar cell is arranged on the foot. The foot can be designed according to the irradiation angle of the sunlight on the solar cell, such that an included angle is formed between the solar cell and the surface of the roof. That is, the solar cell is arranged as inclined on the surface of the roof, such that the solar cell can have more time to be irradiated by direct sunlight. As such, the photoelectric transformation efficiency of the solar cell can be improved.

However, the connection structures between the foot and the solar cell have a large quantity and are very complex, so that installing and demounting of the foot and the solar cell needs to be completed by using a large number of tools, which costs much time and labor, being inconvenient for an installation staff.

SUMMARY

An aspect of the present invention is to provide a solar apparatus.

According to an embodiment of the present invention, a solar apparatus includes a solar cell, a frame, a pair of first support racks and a pair of second support racks. The frame includes a main body and a hollow rib. The main body surrounds the edge of the solar cell. The hollow rib protrudes over the circumference of the main body, and the hollow rib and the solar cell are located on opposite sides of the main body. The first support racks are located on a first side of the frame, and each of the first support racks includes a first engaging clamp for coupling to the hollow rib of the frame. The second support racks are located on a second side facing away from the first side of the frame, and each of the second support racks includes a second engaging clamp for coupling to the hollow rib of the frame.

Another aspect of the present invention is to provide a mounting system for supporting a solar cell module.

According to an embodiment of the present invention, a mounting system includes a first support rack, a second support rack, a first foot and a second foot. The first support rack includes a first engaging portion and a first support portion. The top of the first support portion is connected to the first engaging portion, and the first engaging portion has a first engaging clamp for engaging to a side edge of a solar cell module. The second support rack includes a second engaging portion and a second support portion. The top of the second support portion is connected to the second engaging portion, and the second engaging portion has a second engaging clamp for engaging to another side edge of the solar cell module. The first foot is connected to the terminal of the first support portion. The second foot is connected to the terminal of the second support portion. The height of the first support rack is smaller than the height of the second support rack.

In the aforesaid embodiments of the present invention, the first engaging clamp of the first support rack and the second engaging clamp of the second support rack can be respectively coupled to the hollow rib at two sides of the frame, and the opening directions of the second engaging clamp and the first engaging clamp may be opposite. As such, when the solar cell and the frame are assembled to the first support rack and the second support rack, the hollow rib at two sides of the frame can be respectively inserted into the first engaging clamp of the first support rack and the second engaging clamp of the second support rack, such that the solar cell and the frame are positioned on the first support rack and the second support rack. Furthermore, when the solar cell and the frame are demounted from the first support rack and the second support rack, the hollow rib at two sides of the frame can be respectively pulled out from the first engaging clamp of the first support rack and the second engaging clamp of the second support rack, such that the solar cell and the frame are separated from the first support rack and the second support rack.

The solar apparatus can be installed and demounted easily, without using a large number of tools and connection structures. That is, the solar apparatus not only reduces the time of installing and demounting, but also reduces the cost of materials and labors.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
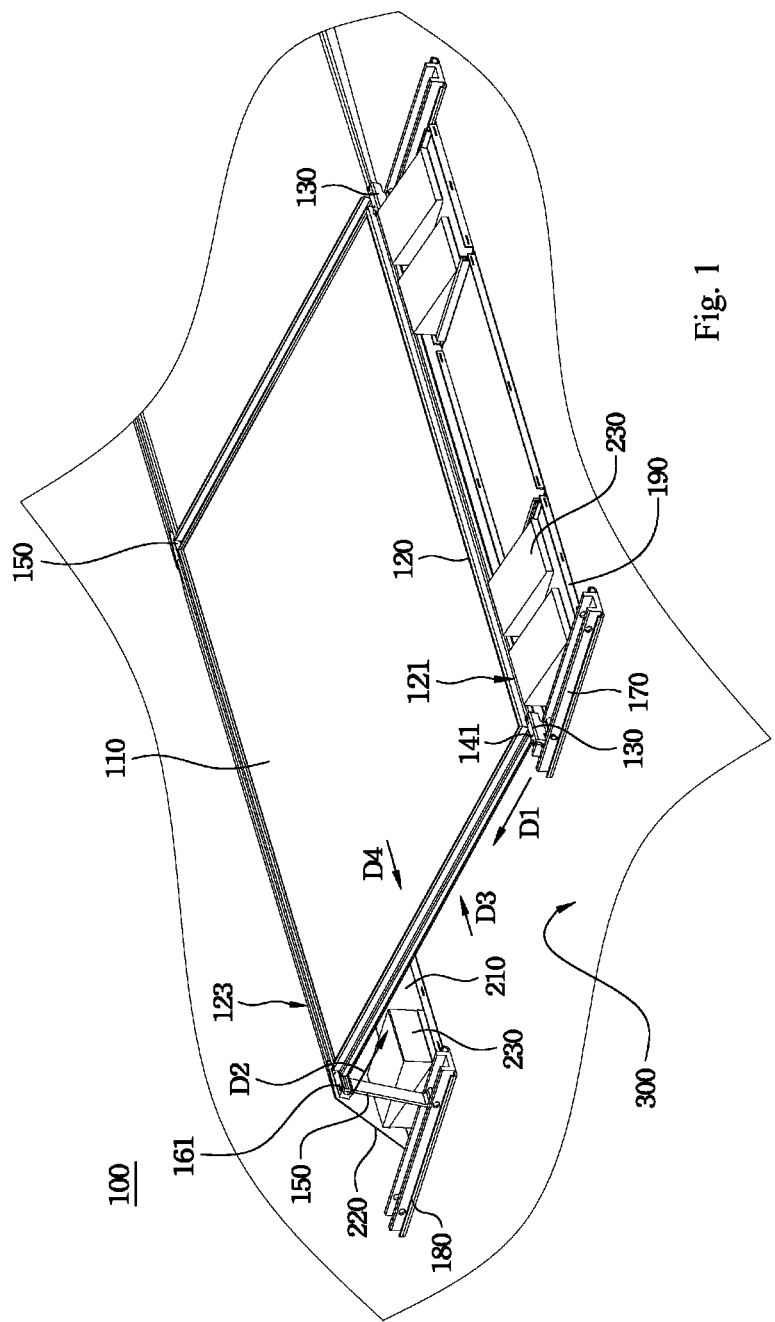
FIG. 1 is a perspective view of a solar apparatus according to an embodiment of the present invention.

FIG. 1 is a perspective view of a solar apparatus 100 according to an embodiment of the present invention. As shown in FIG. 1, the solar apparatus 100 includes a solar cell 110 and a frame 120 of a solar cell module, and a mounting system suitable for supporting the solar cell module. The mounting system includes a first support rack 130 and a second support rack 150. The frame 120 surrounds the solar cell 110. The first support rack 130 is located at a first side 121 of the frame 120. The second support rack 150 is located at a second side 123 of the frame 120. The first side 121 and the second side 123 are respectively located at two opposite sides of the frame 120. The number of the solar cell 110, the first support rack 130 and the second support rack 150 is determined according to the requirement of a designer, and is not limited to the present invention. For example, when the solar apparatus 100 only has a single solar cell 110, the mounting system includes a pair of first support racks 130 and a pair of second support racks 150 to support the solar cell 110. Furthermore, when the number of the solar cell 110 is plural, the number of the first support rack 130 and the second support rack 150 is also plural.

Furthermore, the mounting system further may include a first foot 170, a second foot 180, a first support plate 190, a second support plate 210, a wind diffuser 220 and a plurality of ballasts 230. The first foot 170 is connected to the first support rack 130, and the second foot 180 is connected to the second support rack 150. The first support plate 190 is connected to the first foot 170, and the second support plate 210 is connected to the second foot 180. The ballasts 230 occupy the first support plate 190 and the second support plate 210, such that the first support plate 190 and the second support plate 210 can be fixed on the bearing surface 300 more stably. Furthermore, the wind diffuser 220 is located between the frame 120 and the second support plate 210, such that the solar module mounting system does not shift easily due to a pushing force of an air flow.

In this embodiment, the first foot 170 and the second foot 180 can be located on the bearing surface 300 (such as a roof or the ground) by being secured with screws or bonded with glue. The ballast 230 may be, but not limited to a cement block or a brick.

In the following description, the structures and connection methods of the components of the aforesaid solar module mounting system are described in details.

Figure 2:
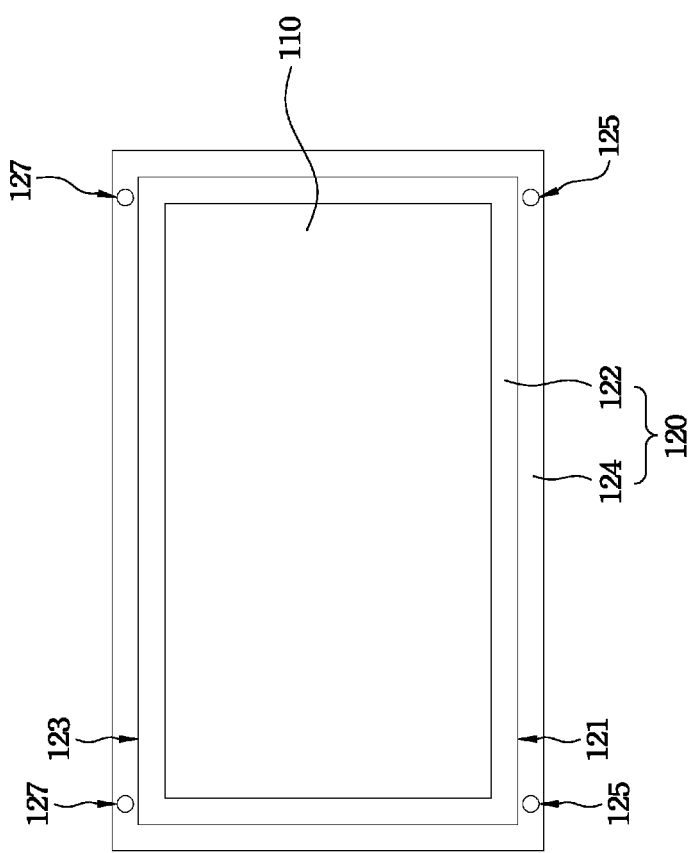
FIG. 2 is a top view of a frame and a solar cell shown in FIG. 1.

FIG. 2 is a top view of the frame 120 and the solar cell 110 shown in FIG. 1. The frame 120 includes a main body 122 and a hollow rib 124, wherein the main body 122 surrounds the periphery of the solar cell 110. The hollow rib 124 protrudes over the circumference of the main body 122. In this embodiment, the hollow rib 124 located at the first side 121 of the frame 120 further has a plurality of first through holes 125 and the hollow rib 124 located at the second side 123 further has a plurality of second through holes 127, so that a fixing component (such as a screw or latch pin) can be inserted thereto. The main body 122 and the hollow rib 124 of the frame 120 may be an integrated component, furthermore, the materials of the frame 120, and the first support rack 130, the second support rack 150, the first foot 170 and the second foot 180 shown in FIG. 1 may include gold, silver, copper, iron, aluminum or other conductive metals.

Figure 3:
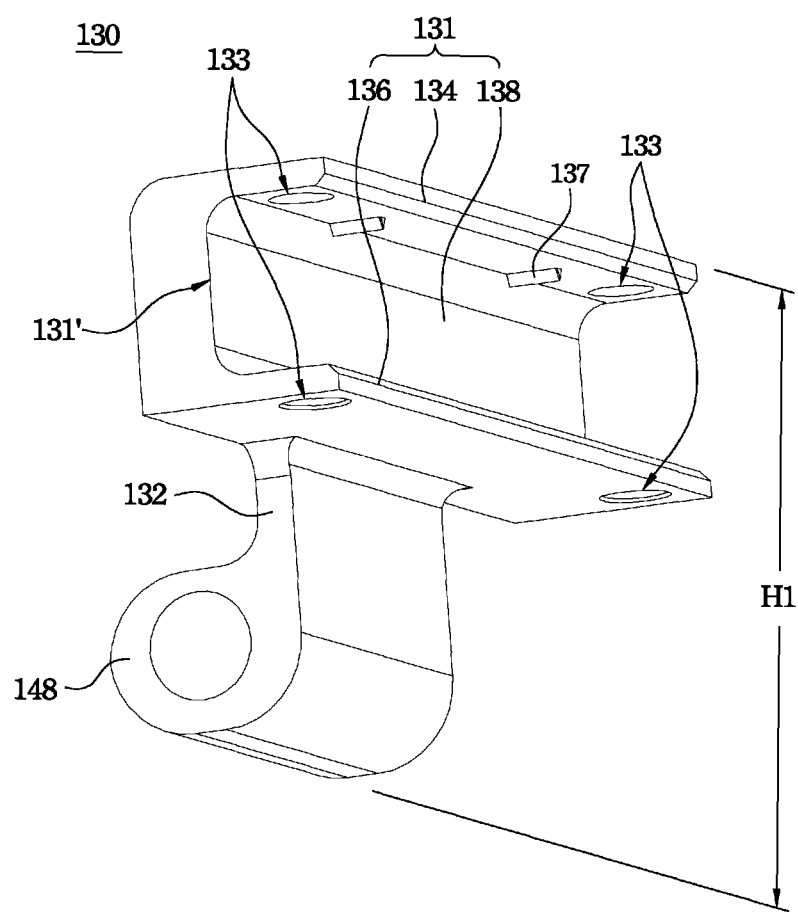
FIG. 3 is a perspective view of a first support rack shown in FIG. 1.

FIG. 3 is a perspective view of the first support rack 130 shown in FIG. 1. As shown in FIGS. 2 and 3, the first support rack 130 has a first engaging portion 131 and a first support portion 132. The first engaging portion 131 has a first engaging clamp 131'. The top of the first support portion 132 is connected to the first engaging portion 131, and the first foot 170 (as shown in FIG. 1) is connected to the terminal of the first support portion 132 of the first support rack 130. The first engaging clamp 131' can clamp the hollow rib 124 located at the first side 121 of the frame 120. More particularly, the first engaging portion 131 includes a first cap 134, a first baseplate 136 and a first side wall 138. The first side wall 138 is connected between the first baseplate 136 and the first cap 134, and the opening of the first engaging clamp 131' is formed by the first cap 134, the first baseplate 136 and the first side wall 138. The bottom surface of the first baseplate 136 is connected to the top of the first support portion 132. The first cap 134 and the first baseplate 136 respectively have a plurality of third through holes 133 approximately aligned in position. Herein "approximately" refers to that one single fixing component can pass through the third through holes 133 of the first cap 134 and the first baseplate 136 at the same time, with an allowable error range of 10%.

In this embodiment, the first cap 134, the first baseplate 136 and the first side wall 138 of the first engaging portion 131 are integrated a unibody. However, in other embodiments, the first cap 134 may alternatively be an independent component, and is combined to the first side wall 138 through a fixing component (described hereafter). The present invention is not limited in this regard. Furthermore, the first cap 134 further has at least one first spike 137 which protrudes towards the first baseplate 136. When the first engaging portion 131 is installed to the hollow rib 124, the conducting and grounding functions between the first engaging portion 131 and the hollow rib 124 can be achieved by scuffing the surface insulation layer of the hollow rib 124 through the first spike 137. The position of the first spike 137 described here is not intended to limit the present invention. For example, the first spike 137 may alternatively be located on the first baseplate 136.

Figure 4:
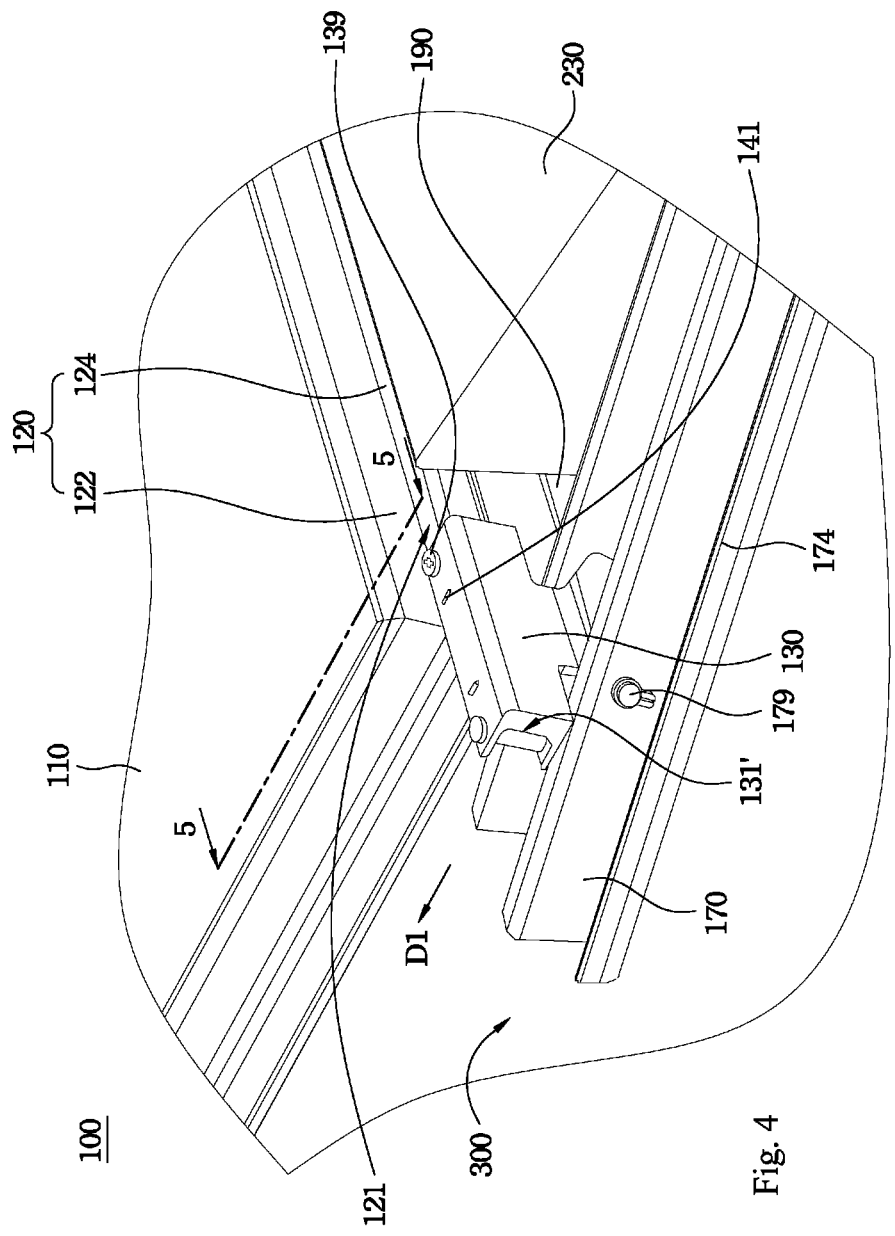
FIG. 4 is a partially enlarged view of the solar apparatus shown in FIG. 1.
Figure 5:
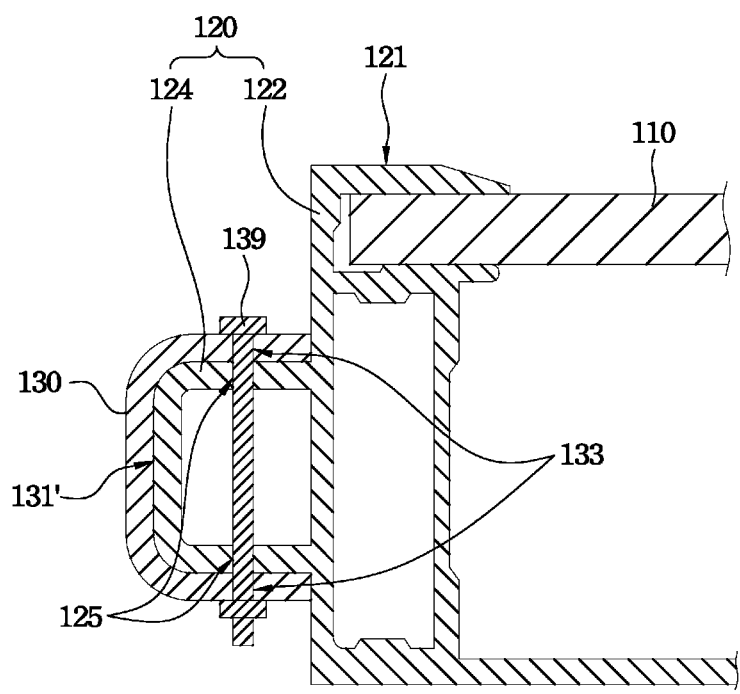
FIG. 5 is a partially cross-sectional view of the solar apparatus shown in FIG. 4 taken along line 5-5.

FIG. 4 is a partially enlarged view of the solar apparatus 100 shown in FIG. 1. FIG. 5 is a partially cross-sectional view of the solar apparatus 100 shown in FIG. 4 taken along line 5-5. As shown in FIGS. 4 and 5, the first support rack 130 is installed to the hollow rib 124 located at the first side 121 of the frame 120 by the first engaging portion 131. The hollow rib 124 located at the first side 121 of the frame 120, which is camped to the first engaging clamp 131' of the first engaging portion 131 has at least one first through hole 125. When the first engaging clamp 131' clamp to the hollow rib 124, the third through hole 133 of the first engaging portion 131 corresponds to the first through hole 125 of the hollow rib 124, such that the first support rack 130 and the frame 120 can be stably fixed by the first fixing component 139 inserting into the third through hole 133 and the first through hole 125 simultaneously. Herein, "correspond" refers to being aligned approximately in position.

In this embodiment, the first cap 134 of the first engaging portion 131 may also has at least one aligning spike 141 which on the opposite surface of the first spike 137 are located thereof. As shown in FIGS. 3 and 4, the aligning spike 141 is aligned to the first spike 137 in position, and the hollow rib 124 may have a notch (not show) for corresponding the first spike 137. When the first support rack 130 is installed to the frame 120, an operator can determine the position of the first spike 137 according to the position of the aligning spike 141, such that the first spike 137 can be corresponding the notch of the hollow rib 124.

Figure 6:
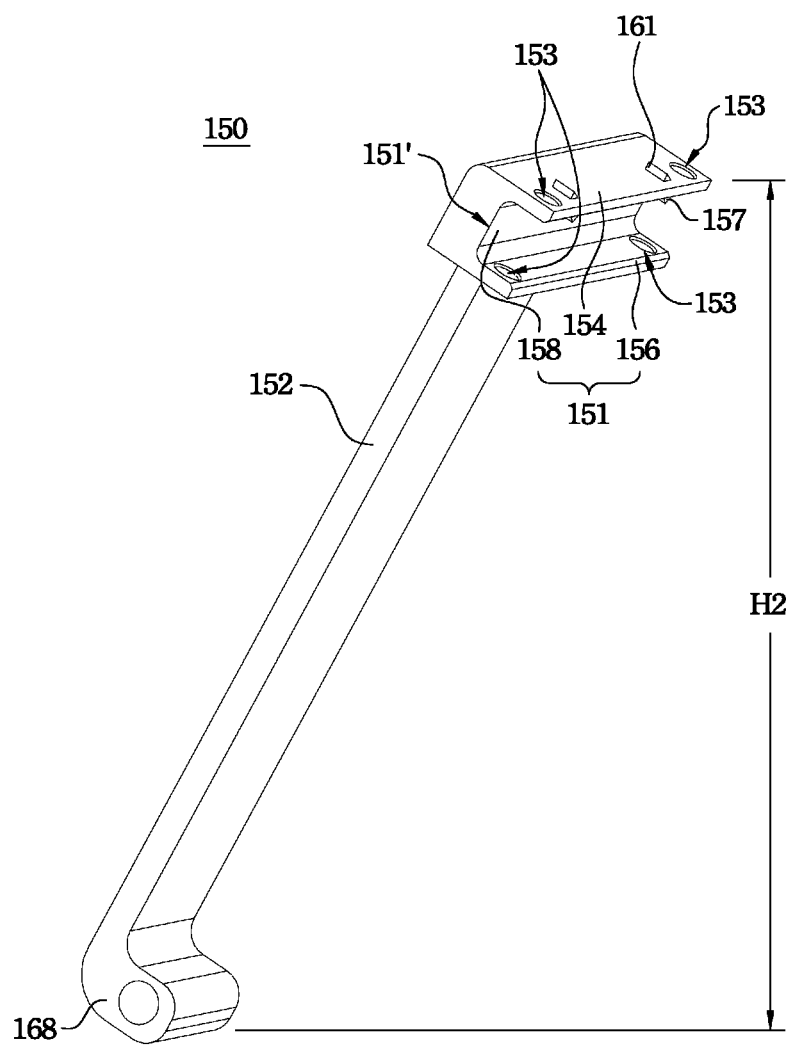
FIG. 6 is a perspective view of a second support rack shown in FIG. 1.

FIG. 6 is a perspective view of the second support rack 150 shown in FIG. 1. As shown in FIGS. 2 and 6, the second support rack 150 has a second engaging portion 151 and a second support portion 152. The second engaging portion 151 has a second engaging clamp 151'. The top of the second support portion 152 is connected to the second engaging portion 151, and the second foot 180 (as shown in FIG. 1) is connected to the terminal of the second support portion 152. The second engaging clamp 151' can clamp the hollow rib 124 located at the second side 123 of the frame 120. More particularly, the second engaging portion 151 includes a second cap 154, a second baseplate 156 and a second side wall 158. The second side wall 158 is connected between the second baseplate 156 and the second cap 154 and the opening of the second engaging clamp 151' is formed by the second cap 154, the second baseplate 156 and the second side wall 158. The bottom surface of the second baseplate 156 is connected to the top of the second support portion 152. The second cap 154 and the second baseplate 156 have a plurality of fourth through holes 153 approximately aligned in position. In this embodiment, the second cap 154, the second baseplate 156 and the second side wall 158 of the second engaging portion 151 are integrated a unibody. However, in other embodiments, the second cap 154 may alternatively be an independent component, and is combined to the second side wall 158 through a fixing component (described hereafter). The present invention is not limited in this regard.

Furthermore, the second cap 154 further has at least one second spike 157 which protrudes towards the second baseplate 156. When the second engaging portion 151 is installed to the hollow rib 124, the conducting and grounding function between the second engaging portion 151 and the hollow rib 124 can be achieved by scuffing the surface insulation layer of the hollow rib 124 through the second spike 157. Additionally, the height H1 (as shown in FIG. 3) of the first support rack 130 is smaller than the height H2 of the second support rack 150. As such, the solar cell 110 (as shown in FIG. 1) can be installed to be inclined above the bearing surface 300, so as to receive more sunlight and make the photoelectric transformation efficiency of the solar cell 110 be improved. A designer can manufacture the first support rack 130 with an appropriate height H1 and the second support rack 150 with an appropriate height H2 according to the sunlight irradiation angles in different areas.

In this embodiment, the second cap 154 of the second support rack 150 may also has an aligning spike 161 which on the opposite surface of the first spike 137 are located thereof, and the aligning spike 161 is aligned to the second spike 157 in position. The aligning spike 161 has a function same as that of the aforesaid aligning spike 141 of the first support rack 130 (as shown in FIG. 4), and thus the function will not be described again.

Figure 7:
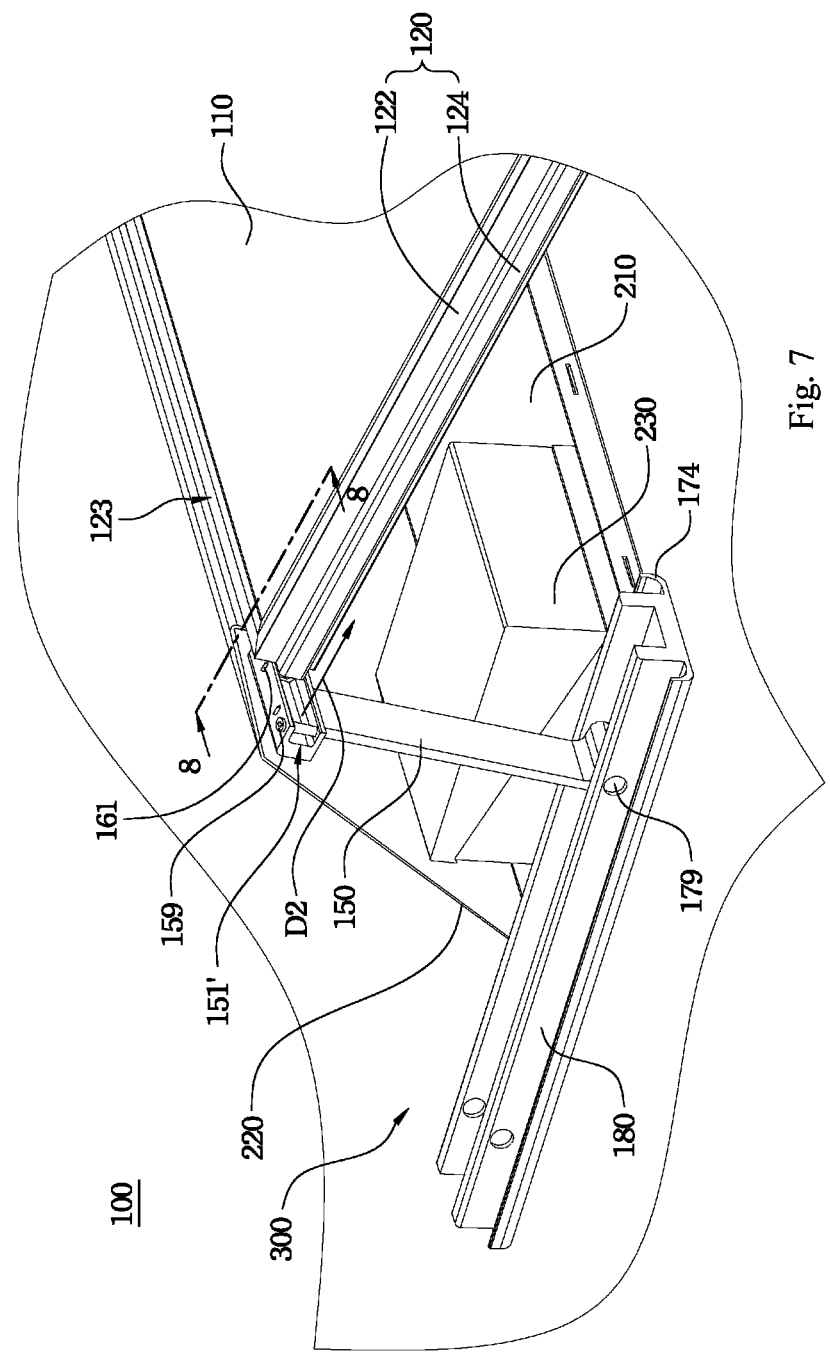
FIG. 7 is a partially enlarged view of the solar apparatus shown in FIG. 1.
Figure 8:
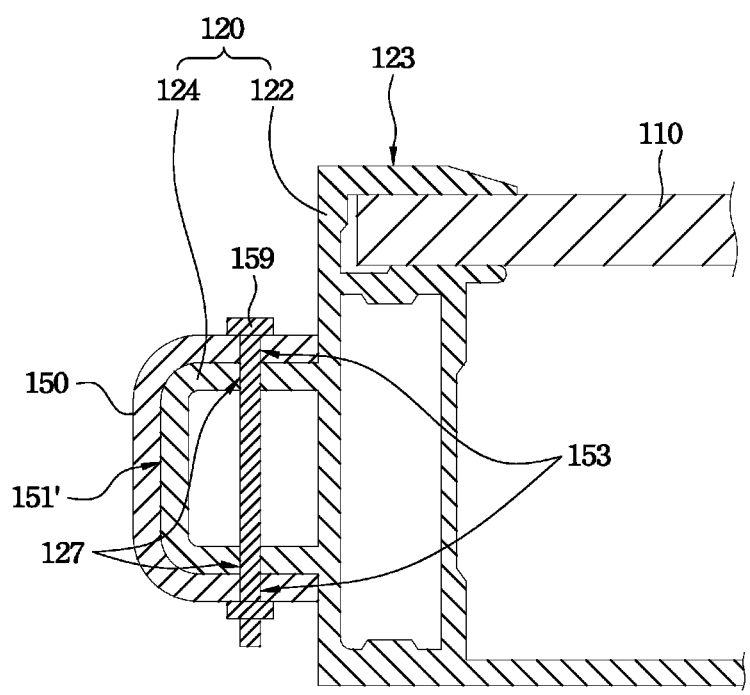
FIG. 8 is a partially cross-sectional view of the solar apparatus shown in FIG. 7 taken along line 8-8.

FIG. 7 is a partially enlarged view of the solar apparatus 100 shown in FIG. 1. FIG. 8 is a partially cross-sectional view of the solar apparatus 100 shown in FIG. 7 taken along line 8-8. As shown in FIGS. 7 and 8, the second support rack 150 is installed to the hollow rib 124 located at the second side 123 of the frame 120 by the second engaging portion 151. The hollow rib 124 located at the second side 123 of the frame 120, which is camped to the second engaging clamp 151' of the second engaging portion 151, has at least one second through hole 127. When the second engaging clamp 151' clamp the hollow rib 124, the fourth through hole 153 of the second engaging portion 151 corresponds to the second through hole 127 of the hollow rib 124, such that the second support rack 150 and the frame 120 can be fixed by coupling the second fixing component 159 into the fourth through hole 153 and the second through hole 127, and thus the frame 120 can be stably fixed by the second fixing component 159 inserting into the fourth through hole 153 and the second through hole 127 simultaneously.

Referring to FIGS. 1, 4 and 7, the opening direction D1 of the first engaging clamp 131' is opposite to the opening direction D2 of the second engaging clamp 151'. When the first support rack 130 and the second support rack 150 are installed onto the frame 120, the hollow rib 124 located at two opposite sides 121, 123 of the frame 120 can be respectively inserted into the first engaging clamp 131' of the first engaging portion 131 and the second engaging clamp 151' of the second engaging portion 151 in a direction D3, such that the solar cell 110 and the frame 120 are positioned on the first support rack 130 and the second support rack 150.

Since the solar cell 110 and the frame 120 have their own gravity, even if the first fixing component 139 (as shown in FIG. 5) and the second fixing component 159 (as shown in FIG. 8) are not used, the solar cell 110 and the frame 120 cannot be easily shifted by camping with the first engaging clamp 131' and the second engaging clamp 151'. The operator can optionally use the first fixing component 139 and the second fixing component 159 to fix the solar cell 110 and the frame 120 more stably into the first support rack 130 and the second support rack 150.

Additionally, when the solar cell 110 and the frame 120 are demounted from the first support rack 130 and the second support rack 150, the hollow rib 124 located at two sides 121, 123 of the frame 120 can be pulled out from the first engaging clamp 131' of the first engaging portion 131 and the second engaging clamp 151' of the second engaging portion 151 in a direction D4 (opposite to the direction D3), such that the solar cell 110 and the frame 120 can be separated from the first support rack 130 and the second support rack 150. Alternatively, a user holds the solar cell 110 at the rear side, and another user removes the second support rack 150 from the frame 120, such that the entire solar cell 110 can be separated from the first support rack 130.

Referring to the first support rack 130 and the second support rack 150 shown at the right side of FIG. 1. When the first support rack 130 and the second support rack 150 are located between two adjacent solar cells 110, the first engaging portion 131 (as shown in FIG. 3) of the first support rack 130 can be engaged to the hollow ribs 124 located at the same sides 121 of the two adjacent frame bodies 120 simultaneously, and the second engaging portion 151 (as shown in FIG. 6) of the second support rack 150 can be engaged to the hollow ribs 124 located at the same sides 123 of the two adjacent frame bodies 120 simultaneously, as long as the length of the first engaging portion 131 and the second engaging portion 151 is enough for bridging the hollow ribs 124 of two adjacent frame bodies 120. That is, the single first support rack 130 and the single second support rack 150 can both be used for engaging the frame bodies 120 of two adjacent solar cells 110.

Figure 9:
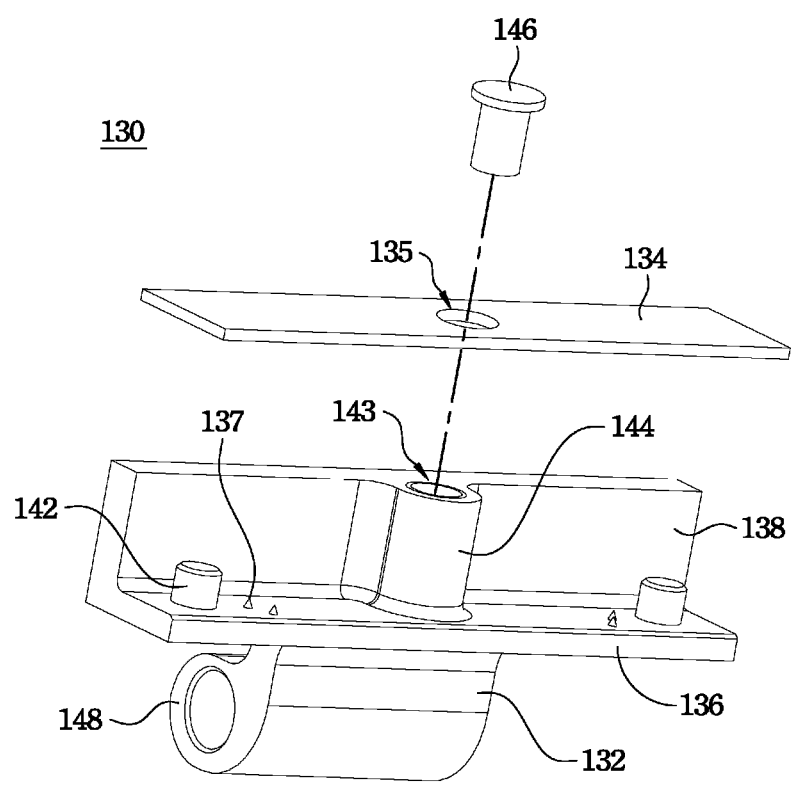
FIG. 9 is a perspective view of a first support rack according to another embodiment of the present invention.
Figure 10:
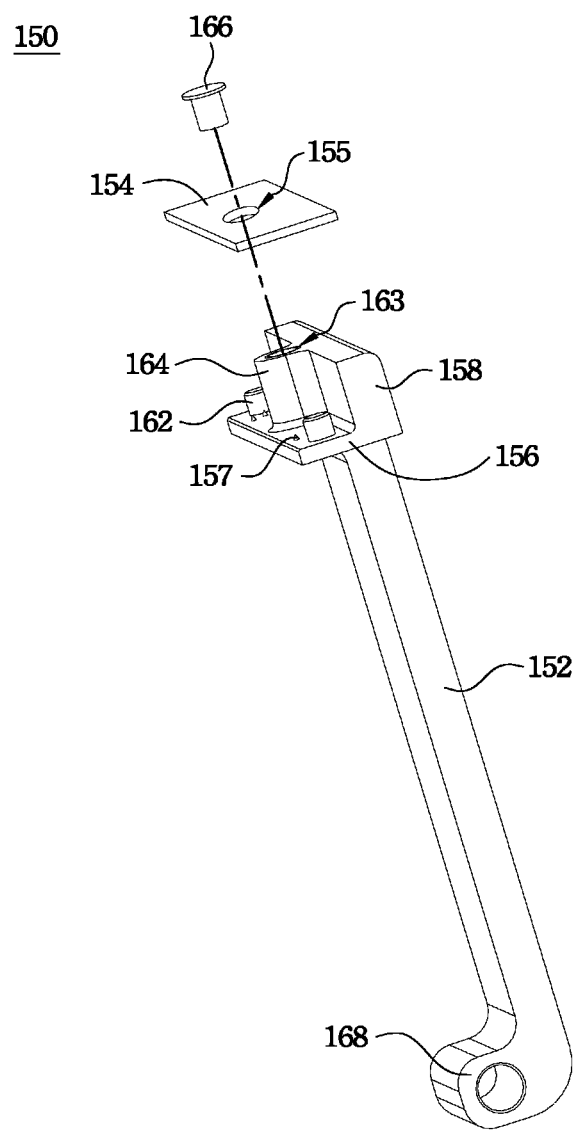
FIG. 10 is a perspective view of a second support rack according to another embodiment of the present invention.

FIG. 9 is a perspective view of the first support rack 130 according to another embodiment of the present invention. FIG. 10 is a perspective view of the second support rack 150 according to another embodiment of the present invention. As shown in FIGS. 9 and 10, the difference between this embodiment and the embodiments of FIGS. 3 and 6 is that: the first cap 134 and the second cap 154 are detachable from the first engaging portion 131 and the second engaging portion 151 respectively. The surface of the first baseplate 136 has at least one first convex 142 for coupling to the first through hole 125 of the hollow rib 124 located at the first side 121 of the frame 120 (as shown in FIG. 5). Similarly, the surface of the second baseplate 156 has at least one second convex 162 for coupling to the second through hole 127 of the hollow rib 124 located at the second side 123 of the frame 120 (as shown in FIG. 8). Furthermore, the first cap 134 has a fifth through hole 135. The first baseplate 136 has a third convex 144, and the third convex 144 includes a first recessed hole 143 thereon. During combination, the fifth through hole 135 of the first cap 134 corresponds to (e.g., is aligned with) the first recessed hole 143 of the third convex 144, and a third fixing component 146 is coupled to the fifth through hole 135 and the first recessed hole 143. In this embodiment, the first baseplate 136 has the first spike 137 which protrudes towards the first cap 134.

Similarly, the second cap 154 has a sixth through hole 155. The second baseplate 156 has a fourth convex 164, and the fourth convex 164 includes a second recessed hole 163 thereon. During combination, the sixth through hole 155 of the second cap 154 corresponds to the second recessed hole 163 of the fourth convex 164, and a fourth fixing component 166 is coupled to the sixth through hole 155 and the second recessed hole 163. The second baseplate 156 has the second spike 157 which protrudes towards the second cap 154.

Figure 11:
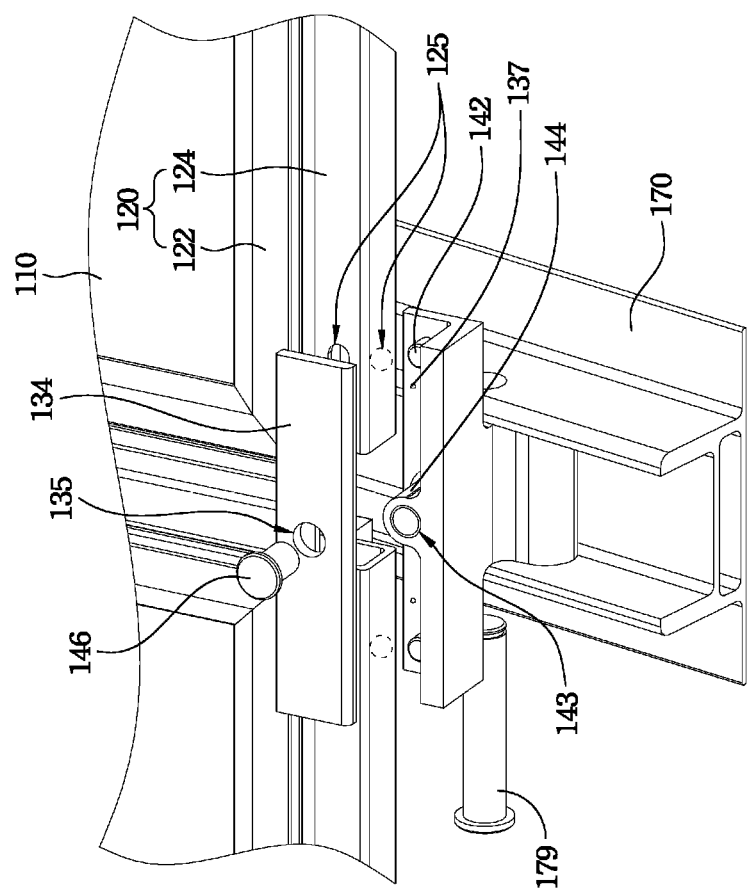
FIG. 11 is a schematic view of the first support rack shown in FIG. 9 when being assembled to the frame.

FIG. 11 is a schematic view of the first support rack 130 shown in FIG. 9 when being installed onto the frame 120. In this embodiment, the first support rack 130 is used for combining the two adjacent frame bodies 120 and the solar cells 110. During combination of two adjacent frames 120, the first convex 142 corresponds to the first through holes 125, and the first convex 142 inserted to the first through hole 125. Subsequently, the third fixing component 146 inserts to the fifth through hole 135 and the first recessed hole 143. At this time, the first spike 137 can scuff the insulation layer of the hollow rib 124 to achieve a conducting and grounding effect. Furthermore, the second convex 162 of the second support rack 150 of FIG. 10 is inserted into the second through hole 127 after being aligned with the second through holes 127 (as shown in FIG. 8) during combination of two adjacent frames 120. Since the fixing method of the second support rack 150 of FIG. 10 is similar to that of the first support rack 130 of FIG. 11, which will not be described again for conciseness.

In the following description, the connection structures of the first support rack 130 and the first foot 170, and the connection structures of the second support rack 150 and the second foot 180 are described in details.

As shown in FIGS. 3 and 6, the terminal of the first support portion 132 has a first communicating tube 148, and the terminal of the second support portion 152 has a second communicating tube 168.

Figure 12:
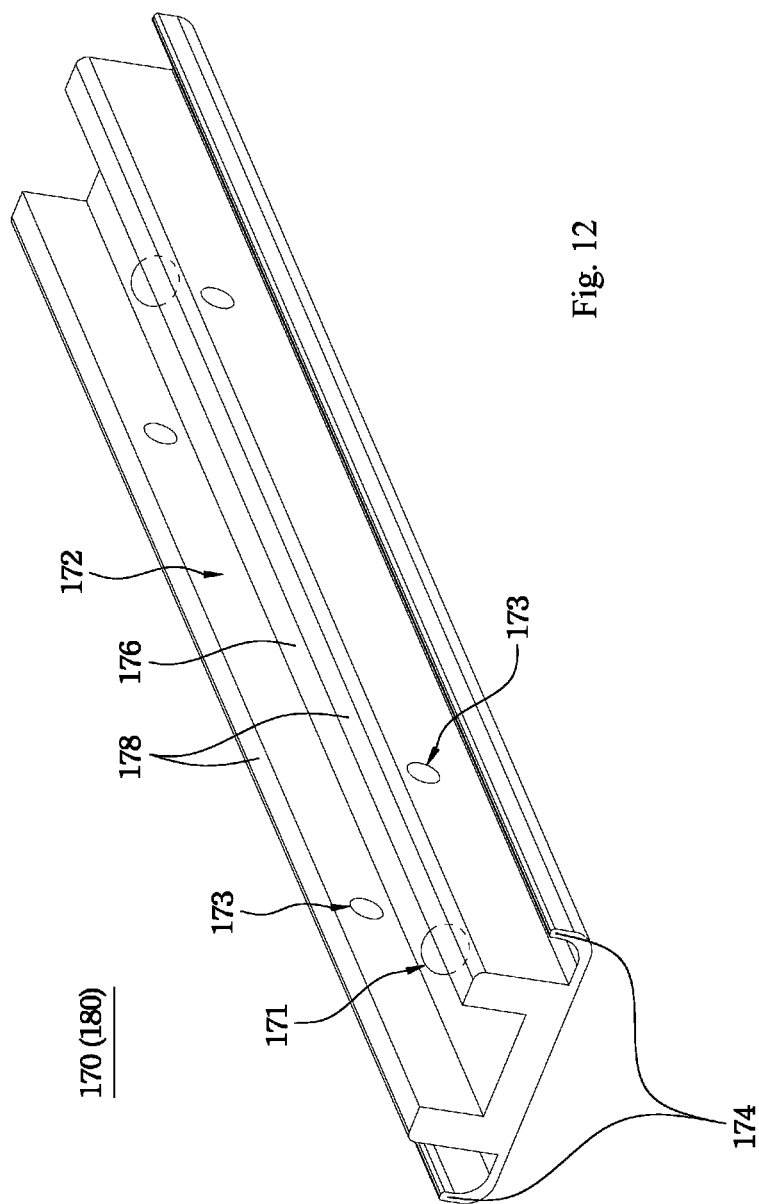
FIG. 12 is a perspective view of a first foot shown in FIG. 1.

FIG. 12 is a perspective view of the first foot 170 shown in FIG. 1. Since the structure of the first foot 170 is similar to that of the second foot 180, although in the following description the first foot 170 is used as an example for illustration, the structure of the second foot 180 is the same as the structure of the first foot 170. Each of the first foot 170 and the second foot 180 has a bottom portion 176 and two side walls 178, and two upward first grips 174 are located at two opposite external-sides of the two side walls 178. The bottom portion 176 and the two side walls 178 form a rail 172, and the two side walls 178 are located at two opposite sides of the bottom portion 176. Moreover, the bottom portion 176 has at least one positioning hole 171, and each of the side walls 178 has at least one seventh through hole 173. The first foot 170 and the second foot 180 can be fixed onto the bearing surface 300 (as shown in FIG. 1) through the positioning through hole 171 by a fixing component (such as a screw).

Referring to FIGS. 3, 4 and 12, the fifth fixing component 179 inserted to the seventh through holes 173 and the first communicating tube 148, such that the first support rack 130 is pivoted to the first foot 170. Similarly, referring to FIGS. 6, 7 and 12, the fifth fixing component 179 also inserted to the seventh through holes 173 and the second communicating tube 168, such that the second support rack 150 is pivoted to the second foot 180. With such a design, when the solar cell 110 and the frame 120 are not combined with the first support rack 130 and the second support rack 150, the first support rack 130 and the second support rack 150 can respectively connect with the first foot 170 and the second foot 180, such that the user can install the solar cell 110 and the frame 120 onto the first support rack 130 and the second support rack 150 conveniently. In this embodiment, each of the side walls 178 has two seventh through holes 173, and the number of the seventh through holes 173 may be determined according to the requirement of the designer.

Figure 13:
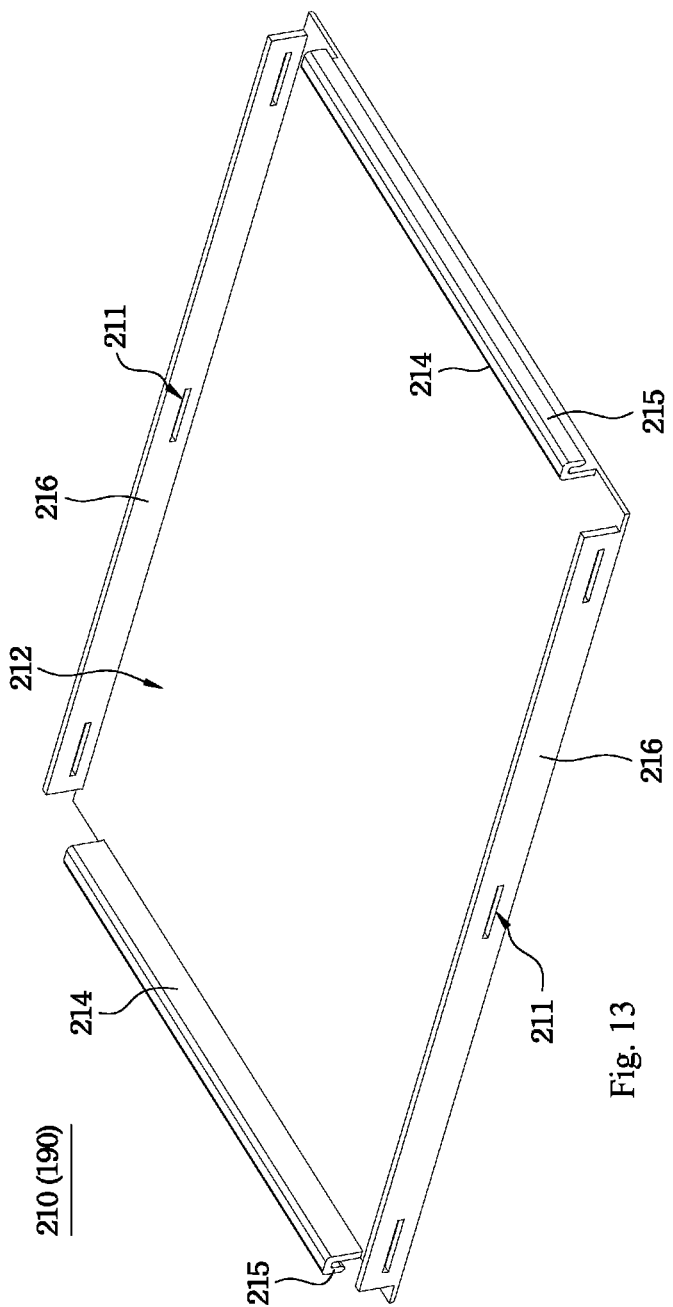
FIG. 13 is a perspective view of a second support plate shown in FIG. 1.

FIG. 13 is a perspective view of the second support plate 210 shown in FIG. 1. As shown in FIGS. 1 and 13, since the structure of the first support plate 190 is similar to that of the second support plate 210, although in the following description the second support plate 210 is used as an example for illustration, the structure of the first support plate 190 is the same as the structure of the second support plate 210. The first support plate 190 is located on the bearing surface 300, and is adjacent to the first foot 170. The second support plate 210 is located on the bearing surface 300, and is adjacent to the second foot 180. Furthermore, each of the first support plate 190 and the second support plate 210 has a support surface 212, and each of the support surfaces 212 has two first retaining walls 214 at two opposite sides thereof. The support surface 212 has two second retaining walls 216 at another two opposite sides thereof. The first retaining wall 214 has a downward second grip 215, and the second retaining wall 216 has a plurality of ninth through holes 211. The plural ballasts 230 occupy the support surfaces 212 of the first support plate 190 and the second support plate 210.

Figure 14:
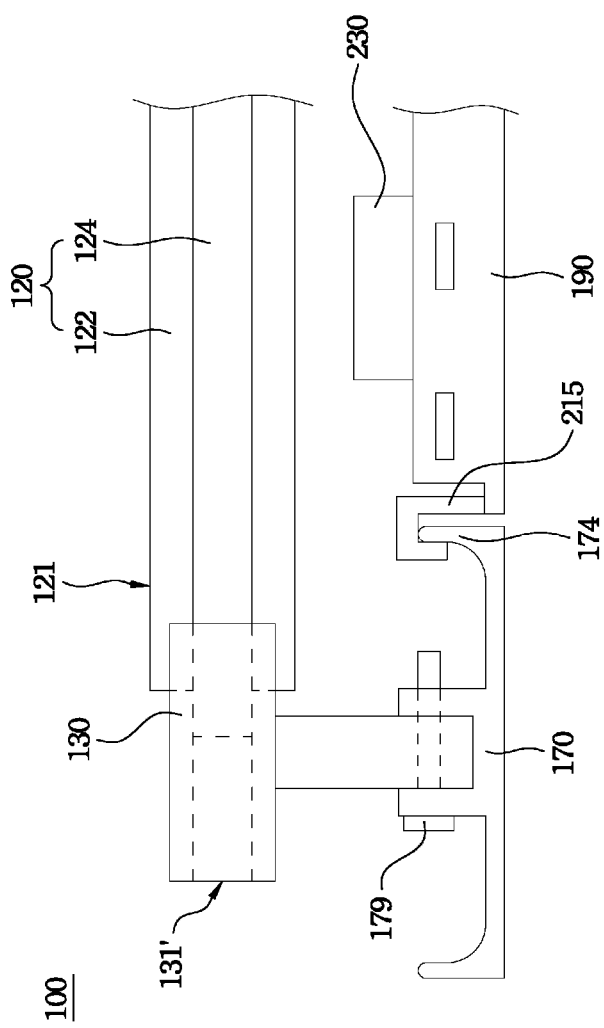
FIG. 14 is a front view where the first foot and the first support plate shown in FIG. 1 are combined.

FIG. 14 is a front view where the first foot 170 and the first support plate 190 shown in FIG. 1 are combined. As shown in FIG. 14, the second grip 215 of the first support plate 190 can be engaged to the first grip 174 of the first foot 170. As such, the ballasts 230 occupy the first support plate 190 can prevent the first support plate 190 from moving due to an external force (such as wind power).

Figure 15:
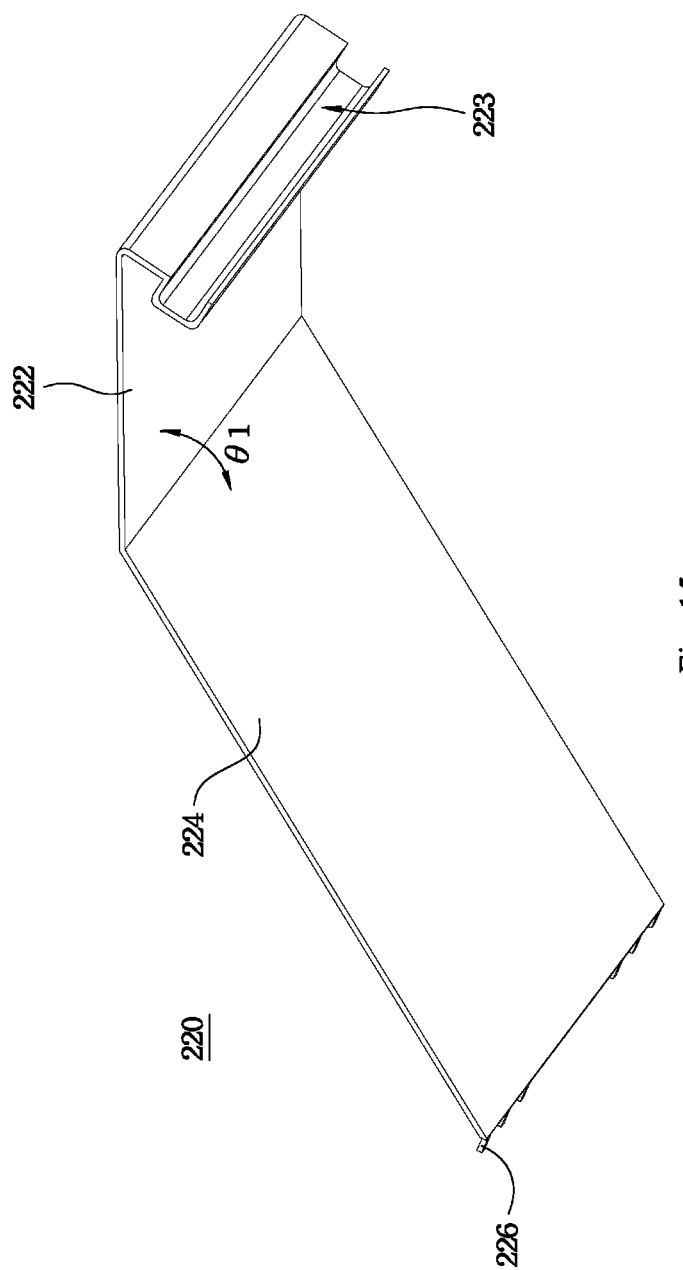
FIG. 15 is a perspective view of a wind diffuser shown in FIG. 1.

FIG. 15 is a perspective view of a wind diffuser 220 shown in FIG. 1. The wind diffuser 220 has a first plate body 222 and a second plate body 224 connected to each other. The first plate body 222 has a third engaging clamp 223, and the second plate body 224 has a plurality of fingers 226. Furthermore, an obtuse angle θ1 is formed between the first plate body 222 and the second plate body 224. In this embodiment, the range of the obtuse angle θ1 is preferably from 120° to 150°.

Figure 16:
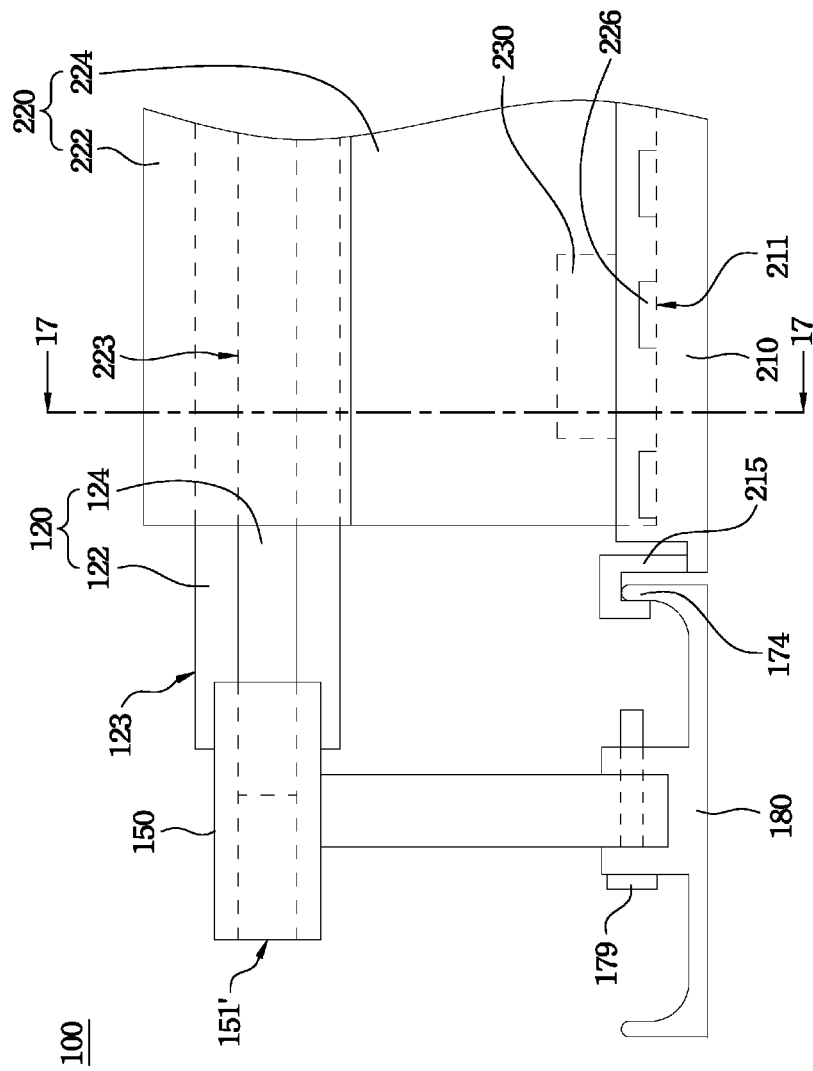
FIG. 16 is a rear view where the second foot, the second support plate and the wind diffuser shown in FIG. 1 are combined.
Figure 17:
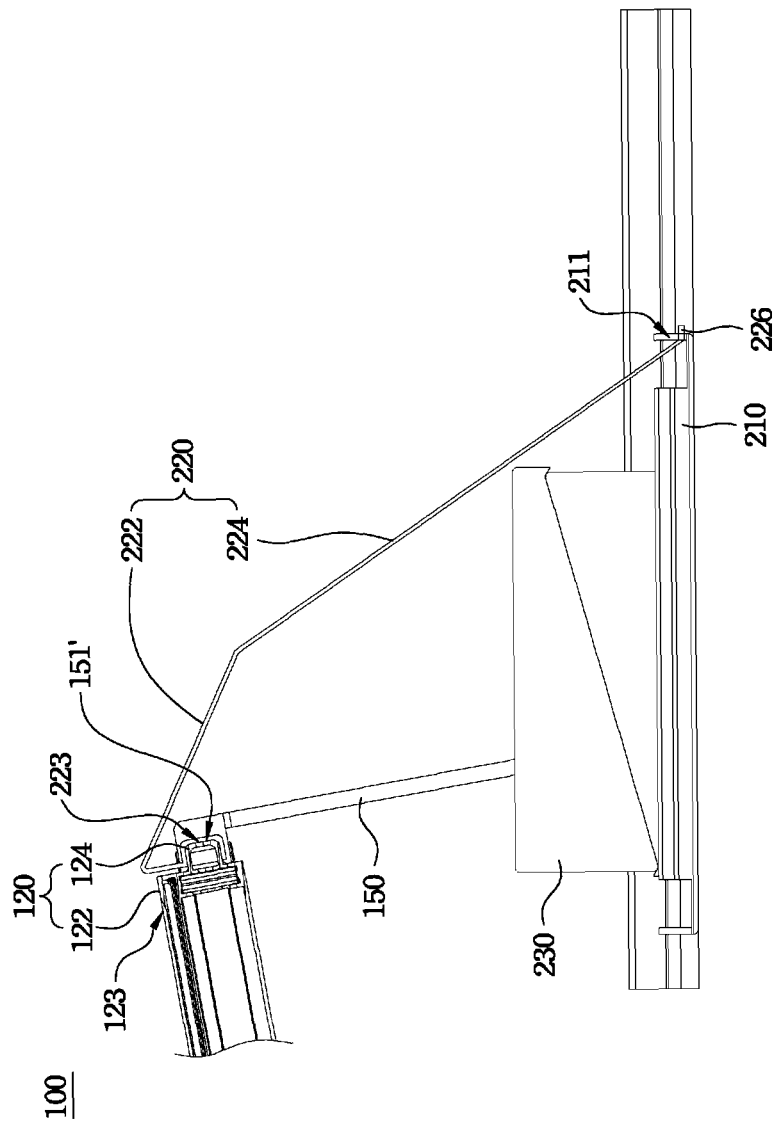
FIG. 17 is a cross-sectional view of the second foot, the second support plate and the wind diffuser shown in FIG. 16 taken along line 17-17.

FIG. 16 is a rear view where the second foot 180, the second support plate 210 and the wind diffuser 220 shown in FIG. 1 are combined. FIG. 17 is a cross-sectional view of the second foot 180, the second support plate 210 and the wind diffuser 220 shown in FIG. 16 taken along line 17-17. As shown in FIGS. 16 and 17, the first plate body 222 of the wind diffuser 220 is abutted against the frame 120, and the second plate body 224 is abutted against the second support plate 210 (as shown in FIG. 13). More particularly, the third engaging clamp 223 of the first plate body 222 of the wind diffuser 220 camped to the hollow rib 124 of the frame 120, and the finger 226 of the second plate body 224 is correspondingly embedded into the ninth through hole 211 of the second support plate 210.

Furthermore, the second support plate 210 is adjacent to the second foot 180, and the second grip 215 of the second support plate 210 can be engaged to the first grip 174 of the second foot 180. As such, the ballasts 230 located on the second support plate 210 can prevent the second support plate 210 from moving due to an external force (such as wind power).

In this embodiment, the third engaging clamp 223 of the first plate body 222 and the second engaging clamp 151' of the engaging clamp 151 can camp to the hollow rib 124 located at the second side 123 of the frame 120 at the same time, and the plural fingers 226 of the second plate body 224 can be embedded into the plural ninth through holes 211 of the second support plate 210. As such, the wind diffuser 220 can be positioned between the frame 120 and the second support plate 210 by the third engaging clamp 223 and the protruding portion 226.

Figure 18:
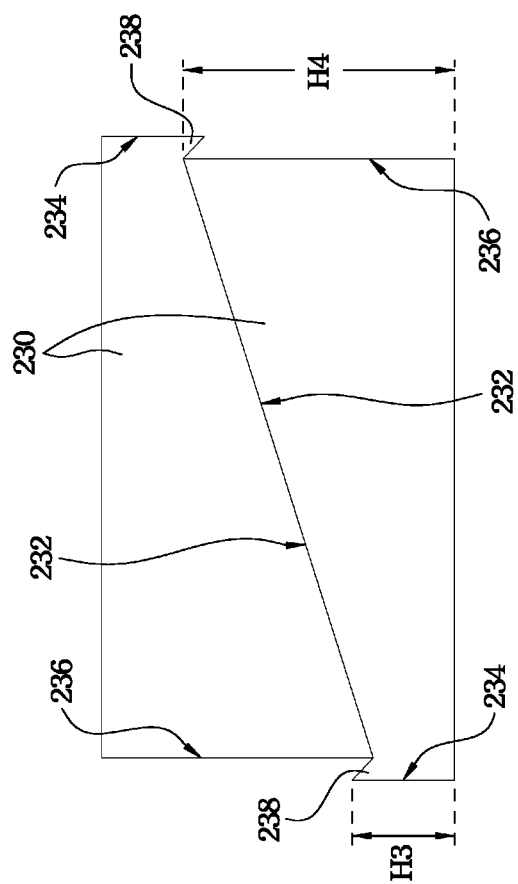
FIG. 18 is a schematic side view where the ballasts shown in FIG. 17 are overlapped.

FIG. 18 is a schematic side view where the ballasts 230 shown in FIG. 17 are overlapped. Each of the ballasts 230 has a wedge shape, and each of the ballasts 230 has an inclined surface 232. Two opposite ends of the inclined surface 232 are defined as a first end surface 234 and a second end surface 236, and the vertical height H3 of the first end surface 234 is smaller than the vertical height H4 of the second end surface 236. Moreover, the first end surface 234 has a stopper 238. When the ballasts 230 are overlapped up and down, the stopper 238 of one of the ballasts 230 can be abutted against the external side of the second end surface 236 of the other ballast 230. Since the first end surface 234 of the ballast 230 has the stopper 238, the overlapped ballasts 230 are not moved relatively due to an external force (such as the wind power).

Also referring to FIG. 1, since the ballast 230 has a wedge shape, when the ballasts 230 not overlapped are placed on the first support plate 190, the inclined surface 232 is regarded as a windward surface, and an air flow can flows easily along the inclined surface 232 of the ballast 230 and the surface of the inclined solar cell 110. As such, the ballasts 230 placed on the first support plate 190 can improve the wind resistance of the entire solar module mounting system.

For simplicity, the connection relationships between the components which have been described in the aforesaid embodiments will not be described again, and only other arrangement methods of the first support rack 130 and the first foot 170 will be described.

Figure 19:
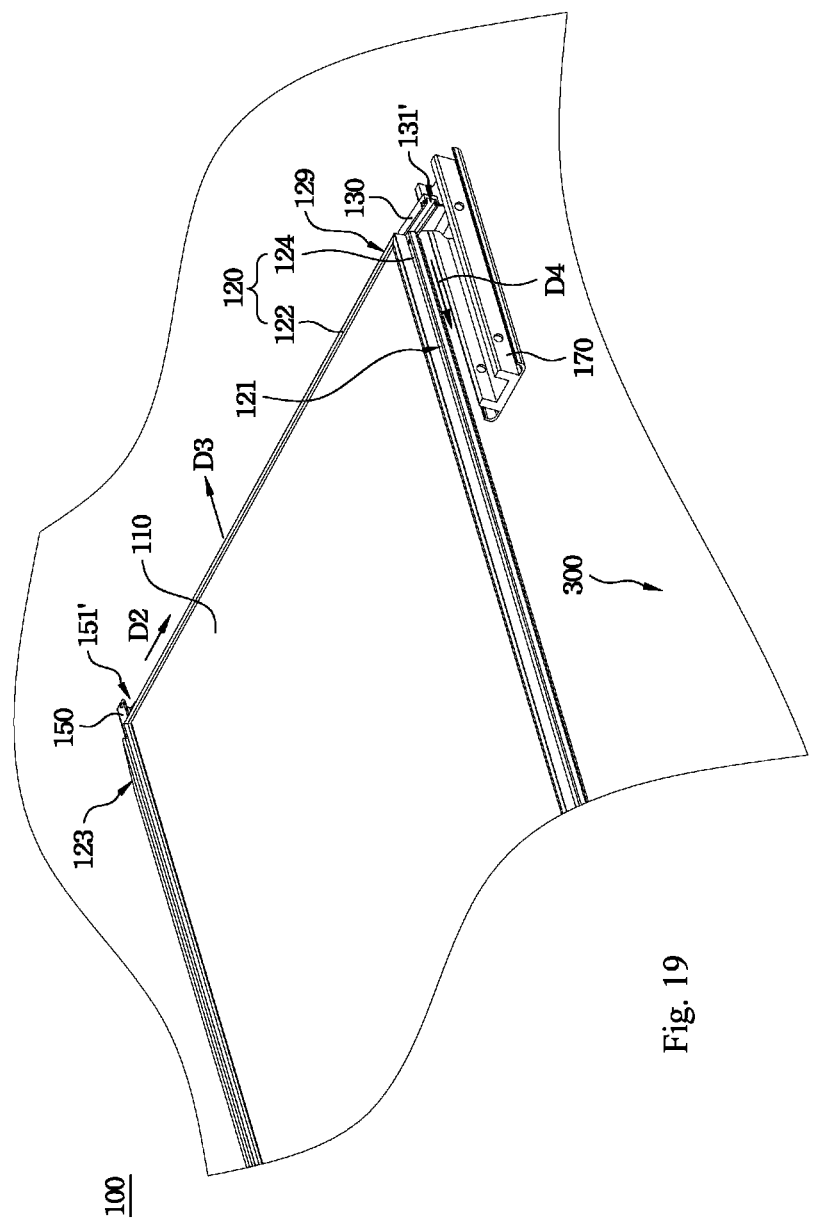
FIG. 19 is a perspective view of a solar apparatus according to another embodiment of the present invention.
Figure 20:
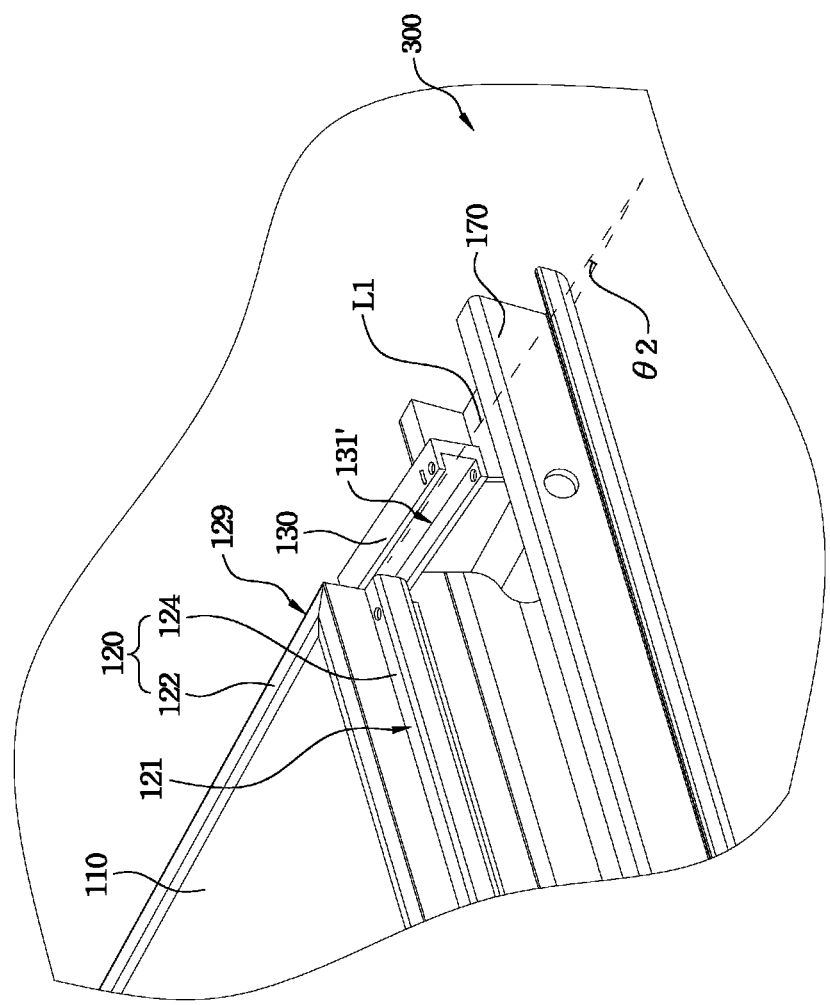
FIG. 20 is a partially enlarged view of the solar apparatus shown in FIG. 19.

FIG. 19 is a perspective view of a solar apparatus 100 according to another embodiment of the present invention. FIG. 20 is a partially enlarged view of the solar apparatus 100 shown in FIG. 19. As shown in FIGS. 19 and 20, the solar apparatus 100 includes the solar cell 110, the frame 120 and the mounting system. The mounting system includes the first support rack 130 and the second support rack 150. The difference between this embodiment and the embodiment shown in FIG. 1 is that: the opening direction D2 of the second engaging clamp 151' of the second support rack 150 is intersected with the opening direction D4 of the first engaging clamp 131' of the first support rack 130. That is, the opening direction D2 is not in parallel to the opening direction D4, and for example may be in perpendicular to each other. In this embodiment, the first engaging clamp 131' of the first support rack 130 and the second engaging clamp 151' of the second support rack 150 are respectively coupled to the hollow ribs 124 located at two adjacent sides 129 and 123 of the frame 120.

In this embodiment, the first support rack 130 can prevent the solar cell 110 and the frame 120 from moving towards the direction D3 (if the hollow ribs 124 are not fixed by using the fixing components 139 and 159 shown in FIGS. 5 and 8), and thus the solar cell 110 and the frame 120 are still can be positioned on the first support rack 130 and the second support rack 150. The axis line L1 of the first engaging clamp 131' can be designed as forming an inclined angle θ2 with the bearing surface 300, such that the solar cell 110 is arranged as inclined above the bearing surface 300. When a solar apparatus is formed by combining a plurality of sets of solar cells, the first support rack 130 in this embodiment can be used for supporting the outermost solar cell module.

Figure 21:
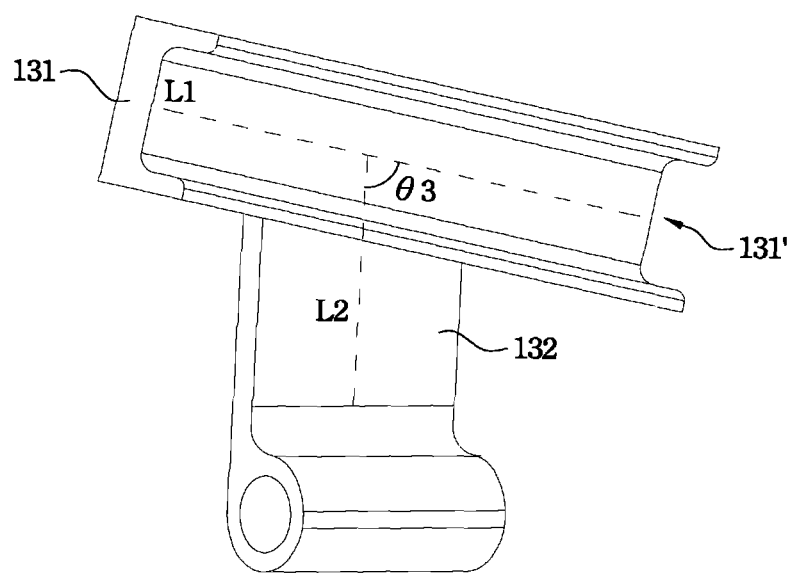
FIG. 21 is a perspective view of the first support rack shown in FIG. 20.

FIG. 21 is a perspective view of the first support rack 130 shown in FIG. 20. As shown in FIG. 21, an included angle θ3 is formed between the axis line L1 (similar to the axis line L1 of the first engaging clamp 131' shown in FIG. 20) of the first engaging portion 131 of the first support rack 130 and the axis line L2 of the first support portion 132. The included angle θ3 is an included angle excepting 90°. Therefore, in FIG. 20, the inclined angle θ2 can be formed between the axis line L1 of the first engaging clamp 131' and the bearing surface 300. Furthermore, the top of the first support portion 132 is also inclined corresponding to the first engaging clamp 131'.

Compared with the prior art, through the aforesaid embodiments of the present invention, the solar apparatus and the mounting system can be installed and demounted easily, without using a large number of tools and connection structures, which not only reduces the time of installing and demounting, but also reduces the cost of materials and labors. When the opening directions of the second engaging clamp and the first engaging clamp are opposite, the hollow rib located at two sides of the frame can be inserted into the first engaging clamp of the first support rack and the second engaging clamp of the second support rack, such that the solar cell and the frame can be positioned on the first support rack and the second support rack. Alternatively, the hollow rib located at two sides of the frame can be pulled out from the first engaging clamp of the first support rack and the second engaging clamp of the second support rack, such that the solar cell and the frame can be separated from the first support rack and the second support rack. Furthermore, when the opening directions of the second engaging clamp and the first engaging clamp are intersected, the solar cell and the frame can be also positioned on the first support rack and the second support rack.

The readers attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar feature.

What is claimed is:

1. A solar apparatus comprising:
a solar cell;
a frame comprising:
a main body surrounding an edge of the solar cell; and
a hollow rib protruding over the circumference of the main body;
a pair of first support racks located on a first side of the frame, wherein each of the first support racks comprises a first engaging clamp that couples to the hollow rib, and each of the first support racks comprises a first support portion and a first engaging portion, and a top of the first support portion is connected to the first engaging portion, and the first engaging portion has the first engaging clamp;
a pair of second support racks located on a second side of the frame facing away from the first side, wherein each of the second support racks comprises a second engaging clamp that couples to the hollow rib, and each of the second support racks comprises a second support portion and a second engaging portion, and a top of the second support portion is connected to the second engaging portion, and the second engaging portion has the second engaging clamp;
a first foot connected to a terminal of the first support portion and having a bottom portion and two side walls, wherein the two side walls of the first foot are located at two opposite sides of the bottom portion of the first foot to form a rail;
a second foot connected to a terminal of the second support portion and having a bottom portion and two side walls, wherein the two side walls of the second foot are located at two opposite sides of the bottom portion of the second foot to form a rail; a first support plate arranged adjacent to the first foot;
a second support plate arranged adjacent to the second foot, wherein each of the first support plate and the second support plate has a bearing surface; each of the bearing surfaces has two first retaining walls at two opposite sides; each of the bearing surfaces has two second retaining walls at another two opposite sides; and the two second retaining walls have a plurality of ninth through holes; and
a wind diffuser having a first plate body and a second plate body connected to each other, wherein the first plate body is abutted against the frame, and the second plate body is abutted against the second support plate.

2. The solar apparatus of claim 1, wherein the first support portion has a first axis line, and the first engaging portion has a second axis line, and an included angle except 90° is formed between the first axis line and the second axis line.

3. The solar apparatus of claim 1, wherein the hollow rib of the frame has a plurality of first through holes and a plurality of second through holes respectively at the first side and the second side of the frame.

4. The solar apparatus of claim 3, wherein the first engaging portion comprises a first cap, a first baseplate and a first side wall, and the first side wall is connected between the first cap and the first baseplate; and the second engaging portion comprises a second cap, a second baseplate and a second side wall, and the second side wall is connected between the second cap and the second baseplate.

5. The solar apparatus of claim 4, wherein the first baseplate has at least one first spike which protrudes towards the first cap, and the second baseplate has at least one second spike which protrudes towards the second cap.

6. The solar apparatus of claim 4, wherein the first cap has at least one first spike which protrudes towards the first baseplate, and the second cap has at least one second spike which protrudes towards the second baseplate.

7. The solar apparatus of claim 4, wherein the bottom surface of the first baseplate is connected to the top of the first support portion, and the bottom surface of the second baseplate is connected to the top of the second support portion.

8. The solar apparatus of claim 4, wherein each of the first cap and the first baseplate has at least one third through hole, the at least one third through hole corresponds to the first through hole of the hollow rib, so that the first support rack and the frame are fixed by coupling a first fixing component into the third through hole and the first through hole.

9. The solar apparatus of claim 4, wherein each of the second cap and the second baseplate has at least one fourth through hole, the at least one fourth through hole corresponds to the second through hole of the hollow rib, so that the second support rack and the frame are fixed by coupling a second fixing component into the fourth through hole and the second through hole.

10. The solar apparatus of claim 4, wherein the surface of the first baseplate has at least one first convex, and the surface of the second baseplate has at least one second convex; the first convex and the second convex respectively correspond to the first through hole and the second through hole of the hollow rib; and the first convex and the second convex are respectively coupled to the first through hole and the second through hole.

11. The solar apparatus of claim 4, wherein the first cap has a fifth through hole; the first baseplate has a third convex; the third convex has a first recessed hole; and the fifth through hole corresponds to the first recessed hole, so that a third fixing component is coupled to the fifth through hole and the first recessed hole.

12. The solar apparatus of claim 4, wherein the second cap has a sixth through hole; the second baseplate has a fourth convex; the fourth convex has a second recessed hole; the sixth through hole and the second recessed hole correspond to each other; and a fourth fixing component is coupled to the sixth through hole and the second recessed hole.

13. The solar apparatus of claim 1, wherein the terminal of the first support portion has a first communicating tube, and the terminal of the second support portion has a second communicating tube.

14. The solar apparatus of claim 13, wherein each of the side walls has at least one seventh through hole, so that a fifth fixing component is coupled to the seventh through hole of the side wall and the first communicating tube or the second communicating tube.

15. The solar apparatus of claim 1, wherein the first plate body has a third engaging clamp engaged to the hollow rib; the second plate body has a plurality of fingers; and the fingers are respectively embedded in the ninth through holes.

16. The solar apparatus of claim 1, wherein an obtuse angle is formed between the first plate body and the second plate body, and the range of the obtuse angle is from 120° to 150°.

17. The solar apparatus of claim 1, further comprising:
a plurality of ballasts arranged on the surface of the first support plate and the surface of the second support plate.

18. The solar apparatus of claim 17, wherein each of the ballasts has a wedge shape; each of the ballasts has an inclined surface; two opposite ends of the inclined surface are defined as a first end surface and a second end surface; and the vertical height of the first end surface is smaller than the vertical height of the second end surface.

19. The solar apparatus of claim 18, wherein the first end surface has a stopper; the ballasts are overlapped up and down; and the stopper is abutted against the external side of the second end surface.

20. The solar apparatus of claim 1, wherein the opening directions of the second engaging clamp and the first engaging clamp are opposite.

21. The solar apparatus of claim 1, wherein the opening directions of the second engaging clamp and the first engaging clamp are intersected with each other.

22. The solar apparatus of claim 1, wherein the height of the first support rack is smaller than the height of the second support rack.

* * * * *